United States Patent
Heo

(10) Patent No.: US 10,461,226 B2
(45) Date of Patent: Oct. 29, 2019

(54) SEMICONDUCTOR LIGHT EMITTING DEVICE PACKAGES

(71) Applicant: SAMSUNG ELECTRONICS CO., LTD., Suwon-si (KR)

(72) Inventor: Manwoo Heo, Hwasung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 15/413,757

(22) Filed: Jan. 24, 2017

(65) Prior Publication Data
US 2017/0236984 A1    Aug. 17, 2017

(30) Foreign Application Priority Data
Feb. 12, 2016 (KR) .................. 10-2016-0016472

(51) Int. Cl.
| H01L 33/56 | (2010.01) |
| H01L 33/54 | (2010.01) |
| H01L 33/50 | (2010.01) |
| H01L 33/62 | (2010.01) |
| H01L 25/075 | (2006.01) |

(52) U.S. Cl.
CPC .......... *H01L 33/507* (2013.01); *H01L 33/54* (2013.01); *H01L 33/56* (2013.01); *H01L 25/0753* (2013.01); *H01L 33/505* (2013.01); *H01L 33/62* (2013.01); *H01L 2224/16225* (2013.01); *H01L 2224/48091* (2013.01); *H01L 2224/73265* (2013.01)

(58) Field of Classification Search
CPC .......... H01L 33/52; H01L 33/54; H01L 33/56
See application file for complete search history.

(56) References Cited

U.S. PATENT DOCUMENTS

| 8,247,827 | B2 | 8/2012 | Helbing | |
|---|---|---|---|---|
| 8,896,010 | B2 | 11/2014 | Tischler | |
| 9,024,334 | B2 | 5/2015 | Agatani et al. | |
| 2010/0078664 | A1 | 4/2010 | Helbing | |
| 2011/0050071 | A1* | 3/2011 | Chung | F21K 9/00 313/46 |
| 2011/0116252 | A1* | 5/2011 | Agatani | F21K 9/00 362/84 |
| 2012/0061702 | A1* | 3/2012 | Andrews | H01L 33/54 257/98 |
| 2012/0097985 | A1 | 4/2012 | Liu et al. | |
| 2012/0112220 | A1 | 5/2012 | West et al. | |

(Continued)

FOREIGN PATENT DOCUMENTS

| JP | 2012-253111 A | 12/2012 |
|---|---|---|
| JP | 2013-251321 A | 12/2013 |

(Continued)

*Primary Examiner* — Phat X Cao
(74) *Attorney, Agent, or Firm* — Sughrue Mion, PLLC

(57) ABSTRACT

Provided is a semiconductor light emitting device package. The semiconductor light emitting device package includes a substrate, a semiconductor light emitting device on the substrate, and an encapsulation layer which covers the semiconductor light emitting device. The encapsulation layer includes a plurality of ring portions which are disposed sequentially from an edge toward a center of the substrate in plan view, and a center portion which is surrounded by an innermost one of the plurality of ring portions.

10 Claims, 15 Drawing Sheets

(56) References Cited

U.S. PATENT DOCUMENTS

| | | |
|---|---|---|
| 2012/0138981 A1 | 6/2012 | Chen et al. |
| 2012/0236568 A1* | 9/2012 | Lee .................. H01L 33/60 |
| | | 362/294 |
| 2013/0241393 A1 | 9/2013 | Hayashida et al. |
| 2014/0103378 A1 | 4/2014 | Lin |
| 2014/0175481 A1 | 6/2014 | Tischler |
| 2015/0214442 A1 | 7/2015 | Chiang et al. |
| 2015/0252258 A1 | 9/2015 | Konishi |
| 2015/0280083 A1 | 10/2015 | Schricker et al. |
| 2015/0287891 A1 | 10/2015 | Liu et al. |

FOREIGN PATENT DOCUMENTS

| | | |
|---|---|---|
| JP | 2014-11197 A | 1/2014 |
| JP | 2014-22435 A | 2/2014 |
| JP | 2014-160742 A | 9/2014 |

\* cited by examiner

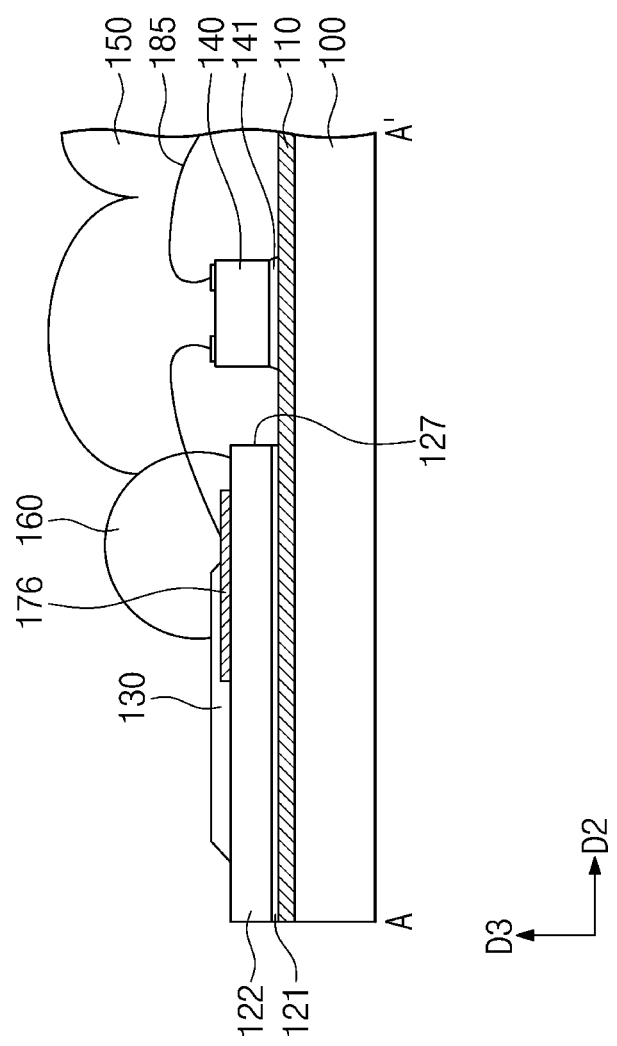

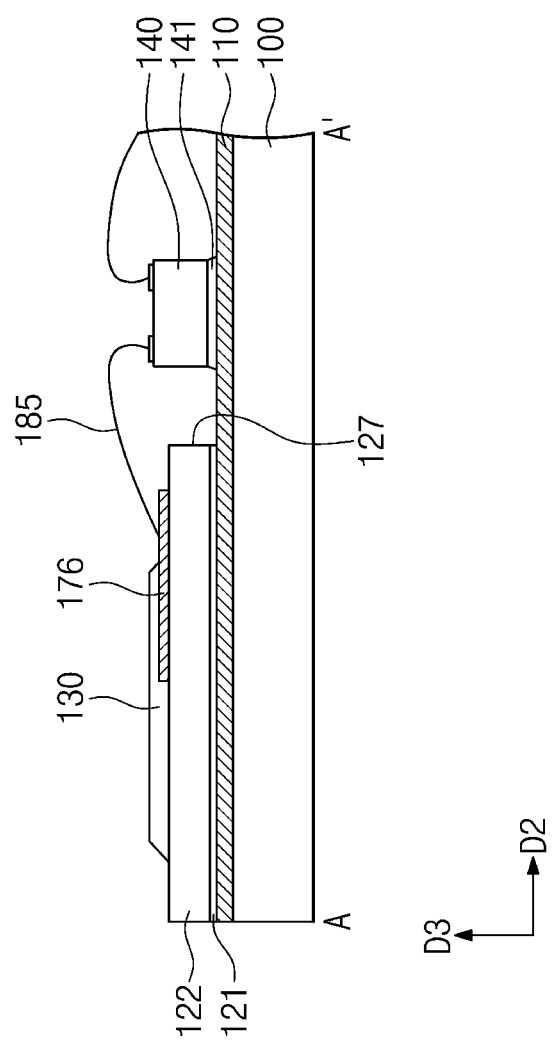

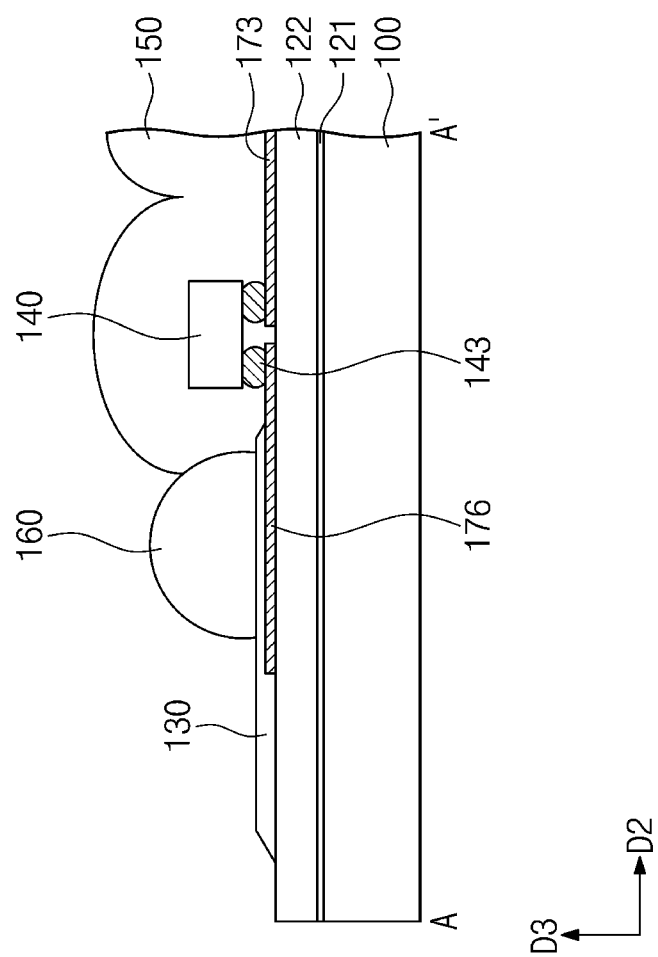

SEMICONDUCTOR LIGHT EMITTING DEVICE PACKAGES

CROSS-REFERENCE TO THE RELATED APPLICATION

This application claims priority from Korean Patent Application 10-2016-0016472 filed on Feb. 12, 2016, the entire disclosure of which is incorporated herein by reference.

BACKGROUND

Apparatuses and methods consistent with the exemplary embodiments of the inventive concept relate to a semiconductor light emitting device package and, more particularly, to a chip on board (COB)-type semiconductor light emitting device package.

A semiconductor light emitting device, such as a light emitting diode, is a device containing a light emitting material therein to emit light. The semiconductor light emitting device releases energy generated due to recombination of electrons and holes in the form of light to be emitted therefrom. Such a light emitting diode (LED) is currently in widespread use as a lighting element, a display device and a light source, and development thereof has been accelerated.

In particular, recent increase in development and application of gallium nitride-based LEDs, and commercialization of mobile device keypads, turn signal lamps, camera flashes, and the like, using the gallium nitride-based LEDs, have led to acceleration of development of general lighting devices using the LEDs. As applications of LEDs have expanded from small portable products to large-sized products having a high output and a high efficiency, such as backlight units of large TVs, headlamps of vehicles, general lighting devices, and the like, it is required for light sources having characteristics suitable for these applications described above.

With the enlargement of the scope of the semiconductor light emitting devices, it is needed for research into improvements in light emitting efficiency and reliability of semiconductor light emitting device packages.

SUMMARY

Exemplary embodiments of the inventive concept provide a semiconductor light emitting device package having increased light extraction efficiency.

According to exemplary embodiments, there is provided a semiconductor light emitting device package which may include: a substrate; a semiconductor light emitting device on the substrate; and an encapsulation layer which covers the semiconductor light emitting device. The encapsulation layer may include: a plurality of ring portions disposed sequentially from an edge toward a center of the substrate, in plan view; and a center portion surrounded by an innermost one of the plurality of ring portions.

According to exemplary embodiments, there is provided a semiconductor light emitting device package which may include: a substrate; a semiconductor light emitting device on the substrate; and an encapsulation layer which covers the semiconductor light emitting device. The encapsulation layer may include convex parts which convexly protrude in a direction away from the substrate. The convex parts may include vertices constituting concentric circles, in plan view.

According to exemplary embodiments, there is provided a semiconductor light emitting device package which may include: a substrate; a plurality of semiconductor light emitting devices on the substrate; and an encapsulation layer which covers the semiconductor light emitting devices. The encapsulation layer may include a first layer and a second layer disposed above the first layer. A top surface of the first layer may be substantially flat while a top surface of the second layer may include a plurality of convex top surface parts.

BRIEF DESCRIPTION OF THE DRAWINGS

The accompanying drawings are included to provide a further understanding of the exemplary embodiments, and are incorporated in and constitute a part of this specification. The drawings illustrate exemplary embodiments and, together with the description, serve to explain principles of the inventive concept. In the drawings:

FIGS. 2A and 2B are cross-sectional views taken along lines A-A' and B-B' of FIG. 1, respectively, according to exemplary embodiments;

FIGS. 3A and 4A are cross-sectional views, taken along line A-A' of FIG. 1, illustrating a method of fabricating a semiconductor light emitting device package, according to exemplary embodiments;

FIGS. 7A and 7B are cross-sectional views, taken along lines A-A' and B-B' of FIG. 1, respectively, illustrating a method of fabricating a semiconductor light emitting device package, according to exemplary embodiments.

DETAILED DESCRIPTION OF EXEMPLARY EMBODIMENTS

Hereinafter, exemplary embodiments of the inventive concept will be described in conjunction with the accompanying drawings.

Figure 1:
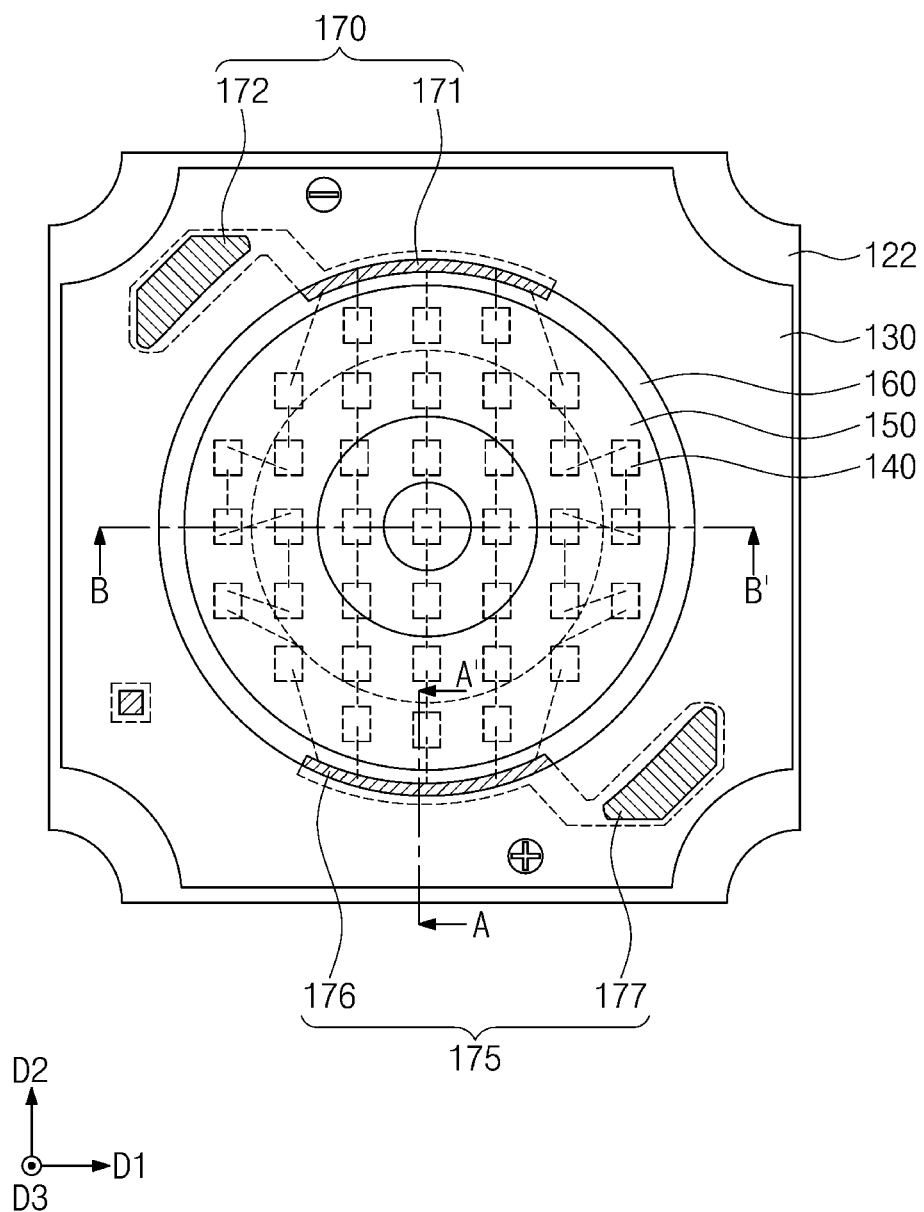
FIG. 1 is a plan view illustrating a semiconductor light emitting device package, according to exemplary embodiments.
Figure 2B:
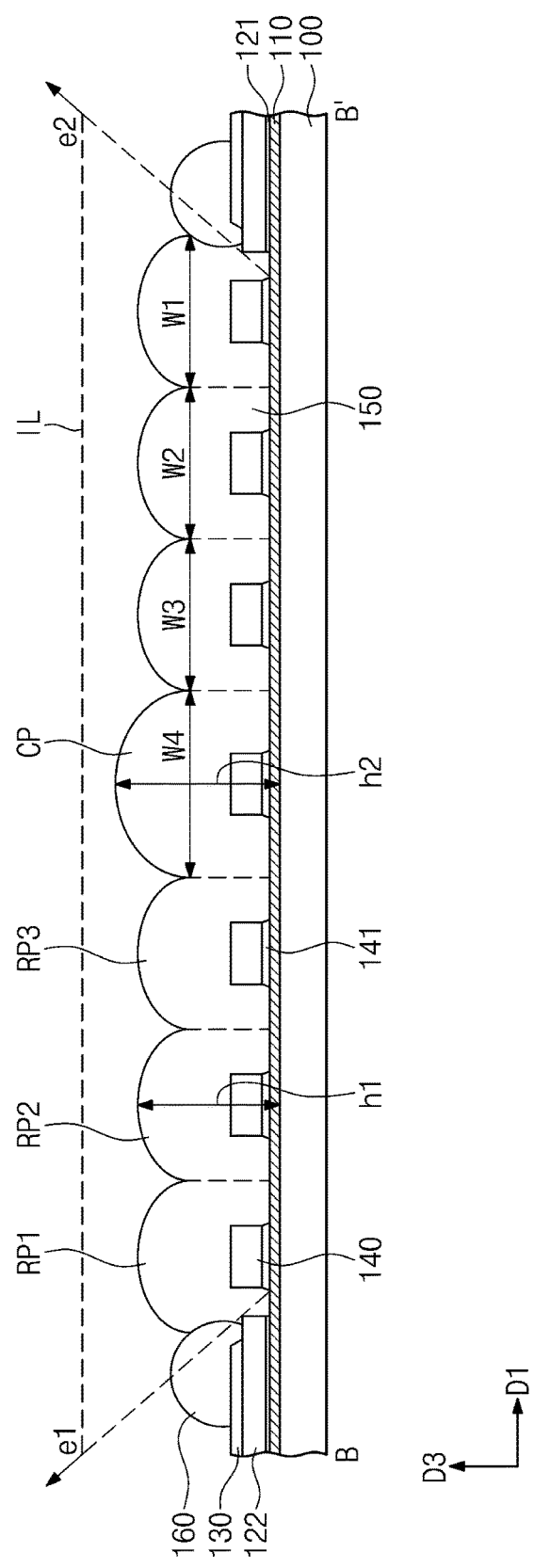

FIG. 1 is a plan view illustrating a semiconductor light emitting device package according to an exemplary embodiment. FIGS. 2A and 2B are cross-sectional views taken along lines A-A' and B-B' of FIG. 1, respectively, according to exemplary embodiments.

Referring to FIGS. 1, 2A and 2B, a semiconductor light emitting device package may be a chip on board (COB)-type package which includes a substrate 100 and one or more semiconductor light emitting devices 140 provided on the substrate 100. For example, the substrate 100 may be a metal substrate such as aluminum, a nitride-based substrate such as aluminum nitride, or an oxide-based substrate such as alumina.

A reflective layer 110 may be provided between the substrate 100 and the semiconductor light emitting device 140. The semiconductor light emitting devices 140 may emit light, and the reflective layer 110 may reflect a portion of light in a direction (referred to hereinafter as a third direction D3) away from the substrate 100. The reflective layer 110 may include a metal, such as silver, whose reflectance is greater than that of the substrate 100.

A metal stack pattern 122 may be provided on the substrate 100 and define a light emitting region on which the semiconductor light emitting devices 140 are provided. For example, the metal stack pattern 122 may include a copper clad laminate (CCL). The metal stack pattern 122 may include an opening 127 which exposes a top surface of the reflective layer 110, and an inside of the opening 127 may be the light emitting region. The metal stack pattern 122 may include a polymer layer and electrodes on the polymer layer. The electrodes may include a cathode 170 and an anode 175. The metal stack pattern 122 may adhere to the reflective layer 110 by a first adhesive pattern 121. For example, the first adhesive pattern 121 may be a thermally conductive adhesive film.

A masking pattern 130 may be proved on the metal stack pattern 122. For example, the masking pattern 130 may include a photo solder resist (PSR). The masking pattern 130 may expose a portion of each of the cathode 170 and the anode 175. For example, the masking pattern 130 may expose a first extension 171 and a first pad 172 of the cathode 170 and expose a second extension 176 and a second pad 177 of the anode 175. The first and second pads 172 and 177 may be terminals to which external power is applied.

The semiconductor light emitting device 140 may be provided in plural. The plurality of semiconductor light emitting devices 140 may be arranged in row and column fashion in the opening 127. The semiconductor light emitting devices 140 may be connected in series between the first extension 171 and the second extension 176. For example, a plurality of wires 185 may be provided to connect the semiconductor light emitting devices 140 to each other and connect the semiconductor light emitting devices 140 to the first and second extensions 171 and 176. For example, the wires 185 may include gold. The wires 185 may connect the semiconductor light emitting devices 140 each other arranged in a second direction D2. For example, the semiconductor light emitting devices 140 may include LED chips.

Each of the semiconductor light emitting devices 140 may adhere to the reflective layer 110 by a second adhesive pattern 141. The second adhesive pattern 141 may be a thermally conductive adhesive film.

A dam structure 160 may be provided to have a ring shape on the metal stack pattern 122. The metal stack pattern 122 may include an inner sidewall which defines the opening 127, and the dam structure 160 may extend along the inner sidewall of the metal stack pattern 122. In this description, the ring shape may include an elliptical ring shape. The dam structure 160 may cover a portion of the masking pattern 130, a portion of the cathode 170, and a portion of the anode 175. For example, the dam structure 160 may have a lower portion of which one side is in contact with the masking pattern 130 and of which an opposite side is in contact with the metal stack pattern 122. The dam structure 160 may define, together with the opening 127, the light emitting region.

For example, the dam structure 160 may include a silicone resin with high thixotropy. In this description, the term of thixotropy may indicate time dependent viscosity. The dam structure 160 may be substantially transparent. In this description, the phrase of substantially transparent may mean that visible light transmittance is more than 90%. It therefore may be possible to prevent or alleviate light trap in the dam structure 160 (particularly at its lower portion) or light block in a traveling path of the light emitted from the semiconductor light emitting devices 140. As a result, a beam angle (i.e., an angle made between e1 and e2 of FIG. 2B) of light IL emitted from the semiconductor light emitting device package may be increased. It may also be advantageous for designing lighting applications including the semiconductor light emitting device package according to the exemplary embodiments. The dam structure 160 may cover portions of the wires 185 connected to the first and second extensions 171 and 176.

An encapsulation layer 150 may be provided to cover the semiconductor light emitting devices 140. The encapsulation layer 150 may fill the light emitting region defined by the opening 127 and the dam structure 160. The encapsulation layer 150 may be in contact with top surfaces and sidewalls of the semiconductor light emitting devices 140. The encapsulation layer 150 may cover the wires 185. For example, the encapsulation layer 150 may include a resin in which fluorescent substances are dispersed. The fluorescent substance may include, for example, green and/or red phosphors.

As viewed in plan, the encapsulation layer 150 may include a plurality of ring portions RP1, RP2 and RP3 that are disposed sequentially from an edge toward a center of the substrate 100. In this description, the phrase of as viewed in plan may mean that the semiconductor light emitting device package is viewed from above in a direction parallel to the third direction D3 as shown in FIG. 1. Though the three ring portions are illustrated for brevity of description, but less or more than three ring portions may be provided. For example, the ring portions may include a first ring portion RP1, a second ring portion RP2, and a third ring portion RP3. The first ring portion RP1 may be spaced apart from the third ring portion RP3 with the second ring portion RP2 interposed therebetween. The encapsulation layer 150 may include a center portion CP surrounded by the ring portions RP1 to RP3. For example, the center portion CP may be disposed within and/or surrounded by the third ring portion RP3 which is an innermost one of the ring portions RP1 to RP3. The first ring portion RP1 may be in contact with the metal stack pattern 122 and the dam structure 160.

The center portion CP and the ring portions RP1 to RP3 may respectively have a convex upper part (referred to hereinafter as a convex part) that protrudes convexly away from the substrate 100 in the third direction D3. Each of the convex parts may have a round top surface. As viewed in plan, vertices of the convex parts may constitute concentric circles. And, a plurality of boundaries between the ring portions RP1 to RP3 and between the third ring portion RP3 and the center portion CP may constitute other concentric circles. The concentric circles may be ellipses.

The first to third ring portions RP1 to RP3 may have first to third widths W1, W2 and W3, respectively. For example, the first to third widths W1 to W3 may be substantially of the same. The first to third ring portions RP1 to RP3 may respectively have a first height h1 from a top surface of the substrate 100. In this description, the height may mean that a distance from a top surface of the substrate 100 to a top end of corresponding one of the ring portions RP1 to RP3. The center portion CP may have a diameter (referred to hereinafter as a fourth width W4) and a second height h2. The fourth width W4 may be greater than the first to third widths W1 to W3. The fourth width W4 may be about 5% to about 40% greater than each of the first to third widths W1 to W3. The second height h2 may be greater than the first height h1. For example, the second height h2 may be about 5% to about 40% greater than the first height h1.

Light emitted from the semiconductor light emitting devices 140 may undergo total reflection caused by difference of refractive index at a boundary between the encapsulation layer 150 and an outside, but the convex parts of the center portion CP and the ring portions RP1 to RP3 may attenuate an amount of total reflection. In other words, the convex parts may increase an amount of light having an incident angle less than a critical angle of total reflection and thus light extraction efficiency may increase. The convex part of the center portion CP may serve as a convex lens.

Figure 3B:
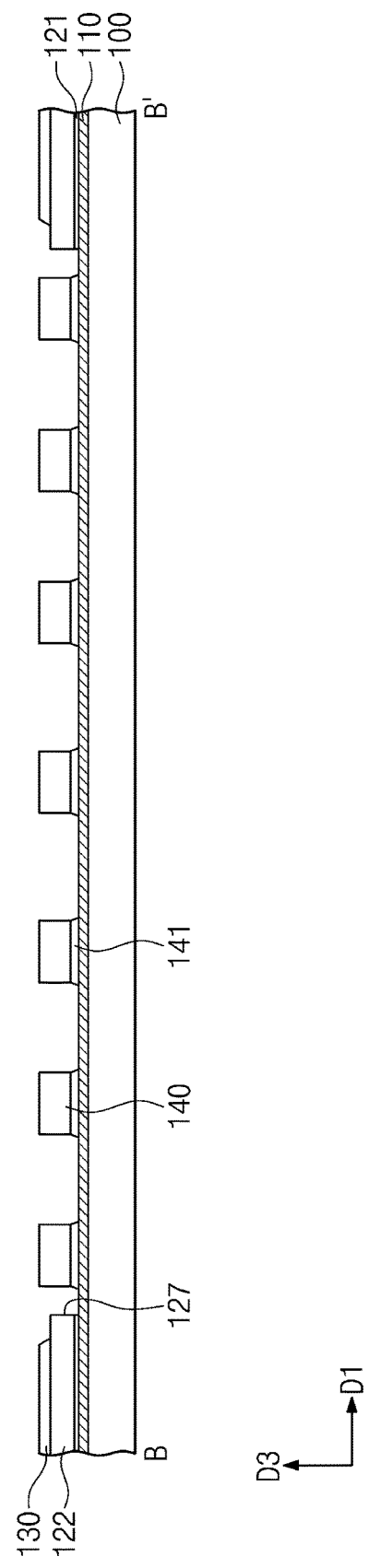
FIGS. 3B and 4B are cross-sectional views taken along line B-B' of FIG. 1, according to exemplary embodiments.
Figure 4A:
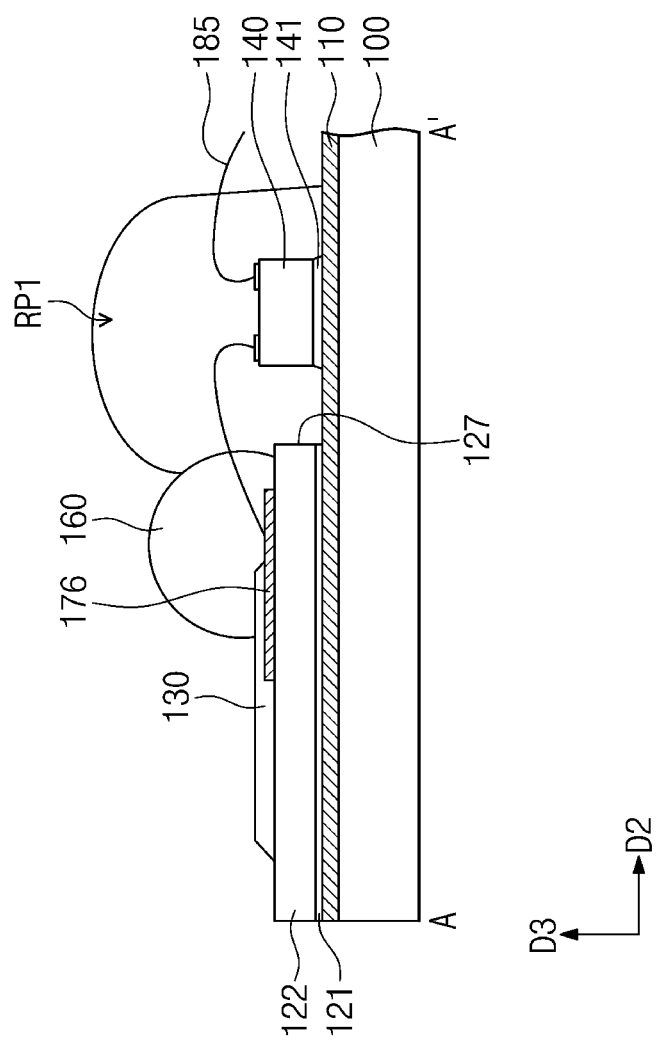
Figure 4B:
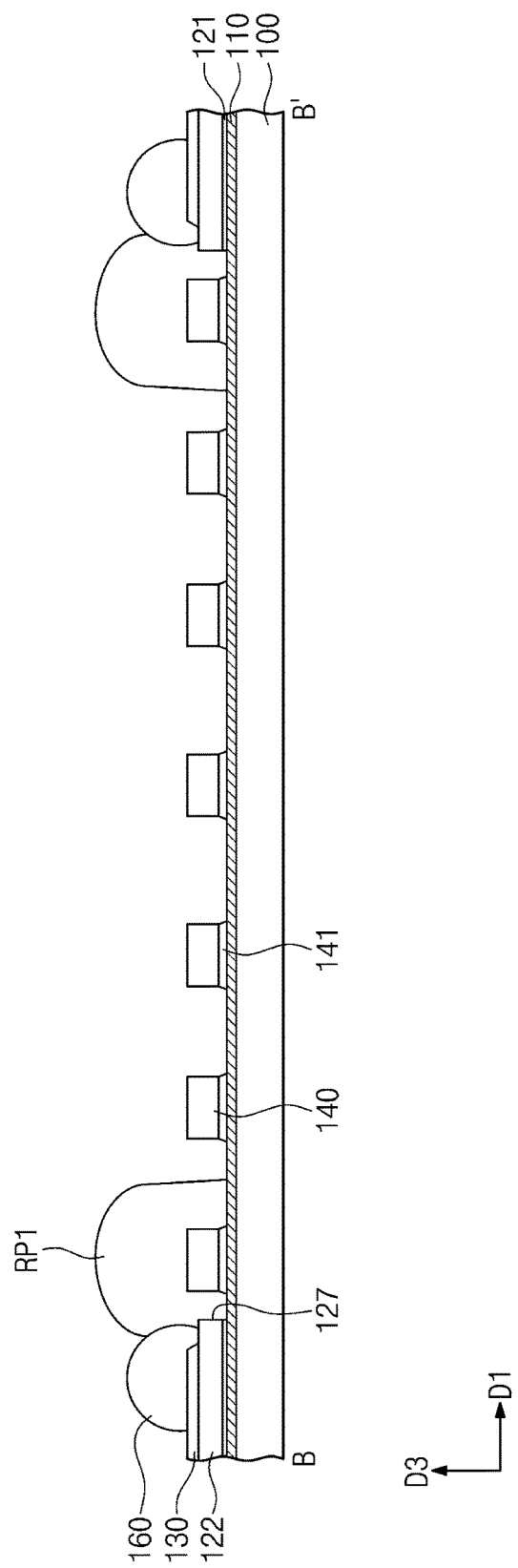

FIGS. 3A and 4A are cross-sectional views, taken along line A-A' of FIG. 1, illustrating a method of fabricating a semiconductor light emitting device package, according to exemplary embodiments. FIGS. 3B and 4B are cross-sectional views taken along line B-B' of FIG. 1, according to exemplary embodiments.

Referring to FIGS. 1, 3A and 3B, a metal stack pattern 122 may be prepared. For example, an upper metal layer on a copper clad laminate may be patterned to form a cathode 170 and an anode 175. A masking pattern 130 may be formed on the copper clad laminate including the cathode 170 and the anode 175 formed thereon. For example, the masking pattern 130 may include a photo solder resist. The masking pattern 130 may be formed by a screen printing process. The masking pattern 130 may expose a portion of each of the cathode 170 and the anode 175. For example, the masking pattern 130 may expose a first extension 171 and a first pad 172 of the cathode 170 and expose a second extension 176 and a second pad 177 of the anode 175.

A first adhesive pattern 121 may adhere to a bottom of the copper clad laminate. For example, the first adhesive pattern 121 may be a thermally conductive adhesive film. A first press process may be performed such that the first adhesive pattern 121 adheres to the bottom of the copper clad laminate. An opening 127 may be formed on the copper clad laminate to which the first adhesive pattern 121 adhere. For example, a drilling process may be conducted to form the opening 127. A metal stack pattern 122 may then be formed.

The metal stack pattern 122 may adhere to a substrate 100 on which a reflective layer 110 is provided. A second press process may be carried out such that the metal stack pattern 122 adheres to the substrate 100. The substrate 100 may be a metal substrate such as aluminum, a nitride-based substrate such as aluminum nitride, or an oxide-based substrate such as alumina. The reflective layer 110 may include a metal, such as silver, whose reflectance is greater than that of the substrate 100.

A plurality of semiconductor light emitting devices 140 may adhere to the reflective layer 110 that is exposed through the opening 127. Each of the semiconductor light emitting devices 140 may adhere to the reflective layer 110 by a second adhesive pattern 141. The second adhesive pattern 141 may be a thermally conductive adhesive film. The semiconductor light emitting devices 140 may be connected in series between the first extension 171 and the second extension 176. For example, a plurality of wires 185 may be provided to connect the semiconductor light emitting devices 140 to each other and connect the semiconductor light emitting devices 140 to the first and second extensions 171 and 176.

Referring to FIGS. 1, 4A and 4B, a ring-shaped dam structure 160 may be provided on the metal stack pattern 122. The metal stack pattern 122 may include an inner sidewall which defines the opening 127, and the dam structure 160 may extend along the inner sidewall of the metal stack pattern 122. The dam structure 160 may cover a portion of the masking pattern 130, a portion of the cathode 170, and a portion of the anode 175. For example, the dam structure 160 may have a lower portion of which one side is in contact with the masking pattern 130 and of which an opposite side is in contact with the metal stack pattern 122.

For example, the dam structure 160 may include a silicone resin with high thixotropy. The dam structure 160 may be formed by a dispenser including a nozzle. The dam structure 160 may cover portions of the wires 185 connected to the first and second extensions 171 and 176.

A first ring RP1 may be formed. The first ring portion RP1 may be formed along the dam structure 160 and a sidewall of the opening 127. The first ring portion RP1 may be formed to have a top end above a top surface of the dam structure 160, but the inventive concept is not limited thereto. The first ring portion RP1 may include, for example, a resin in which fluorescent substances are dispersed. The first ring portion RP1 may be formed by a dispenser including a nozzle. For example, the first ring portion RP1 may be formed by dispensing the fluorescent substance-dispersed resin in a clockwise or counterclockwise direction around a point of the opening 127. As the first ring portion RP1 is formed of a high thixotropic material, the first ring portion RP1 may be less or hardly deformed with the passage of time from an initial dispensing. Accordingly, an upper part of the first ring portion RP1 may be maintained convex.

Referring back to FIGS. 1, 2A and 2B, a second ring portion RP2, a third ring portion RP2, and a center portion CP may be sequentially formed to create an encapsulate layer 150. The first to third ring portions RP1, RP2 and RP3 may be formed to have first to third widths W1, W2 and W3, respectively. For example, the first to third widths W1 to W3 may be substantially of the same. The first to third ring portions RP1 to RP3 may respectively have a first height h1 from a top surface of the substrate 100. The center portion CP may have a diameter (referred to hereinafter as a fourth width W4) and a second height h2. The fourth width W4 may be greater than the first to third widths W1 to W3. The second height h2 may be greater than the first height h1.

Figure 5A:
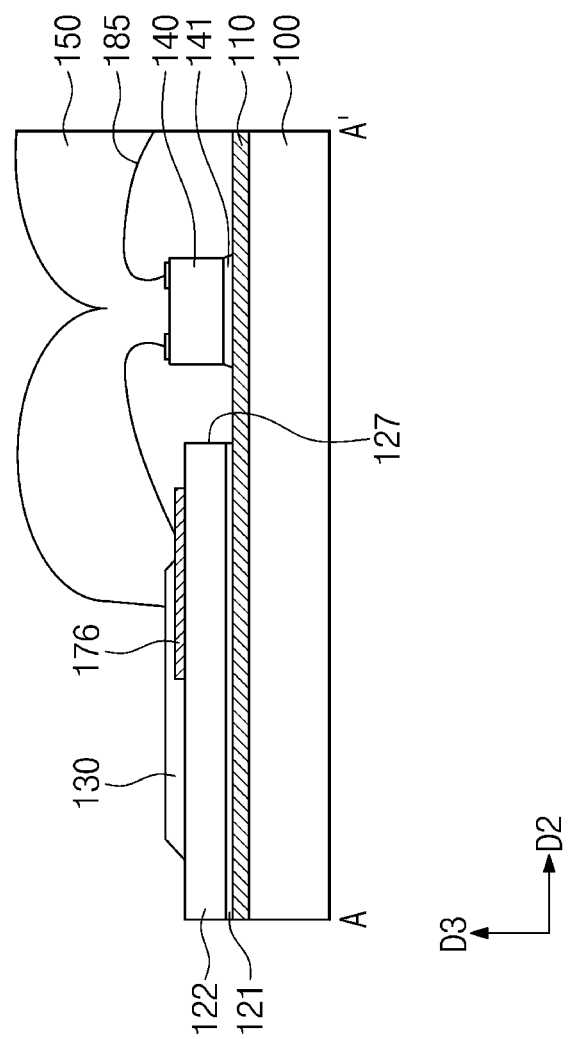
FIGS. 5A and 5B are cross-sectional views, taken along lines A-A' and B-B' of FIG. 1, respectively, illustrating a method of fabricating a semiconductor light emitting device package, according to exemplary embodiments.
Figure 5B:
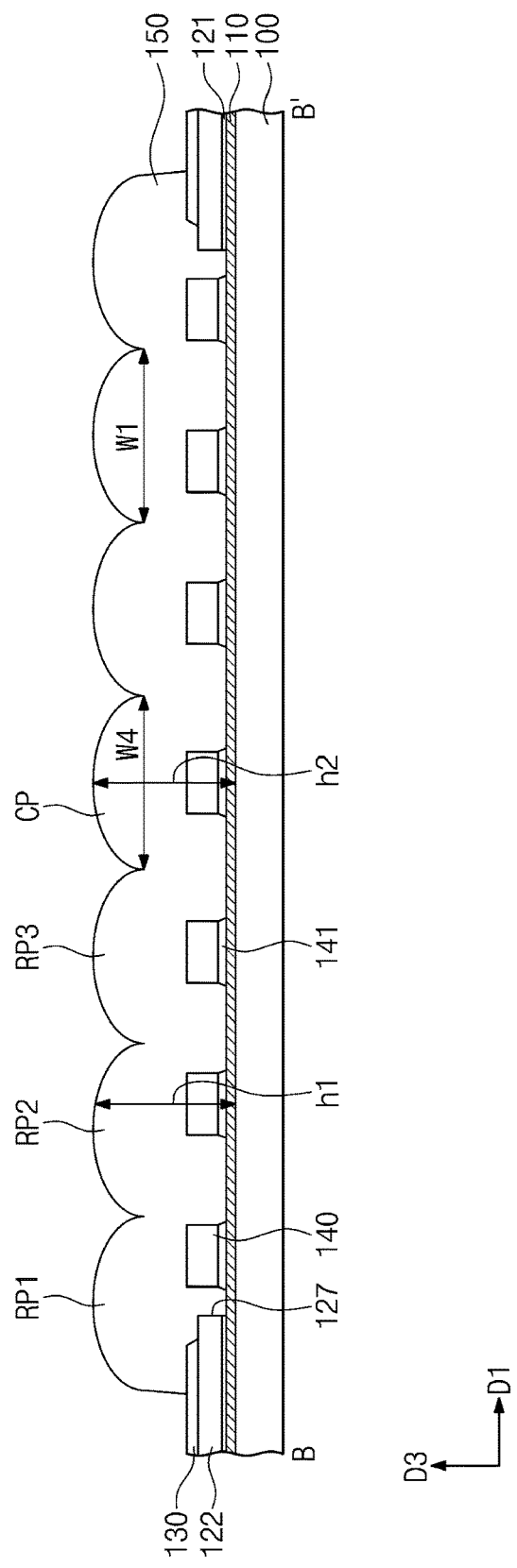

FIGS. 5A and 5B are cross-sectional views, taken along lines A-A' and B-B' of FIG. 1, respectively, illustrating a method of fabricating a semiconductor light emitting device package, according to exemplary embodiments. A repetitive description may be omitted for conciseness.

Referring to FIGS. 1, 5A and 5B, the semiconductor light emitting device package may not include the dam structure 160 described with reference to FIGS. 2A and 2B. Since the encapsulation layer 150 is formed of a high thixotropic material, it may not be required to form the dam structure 160. In case that the dam structure 160 is not formed, a distance between the light emitting region and the electrodes (i.e., cathode 170 and anode 175) may be additionally secured such that it may be advantageous when a lighting applications is subject to assembly process such as soldering or the like.

The first to third ring portions RP1, RP2 and RP3 of the encapsulation layer 150 may have a first width W1, and the center portion CP may have a fourth width W4. The fourth width W4 may be substantially the same as the first width W1. The first to third ring portions RP1 to RP3 may have a first height h1, and the center portion CP may have a second height h2. The second height h2 may be substantially the same as the first height h1.

Figure 6A:
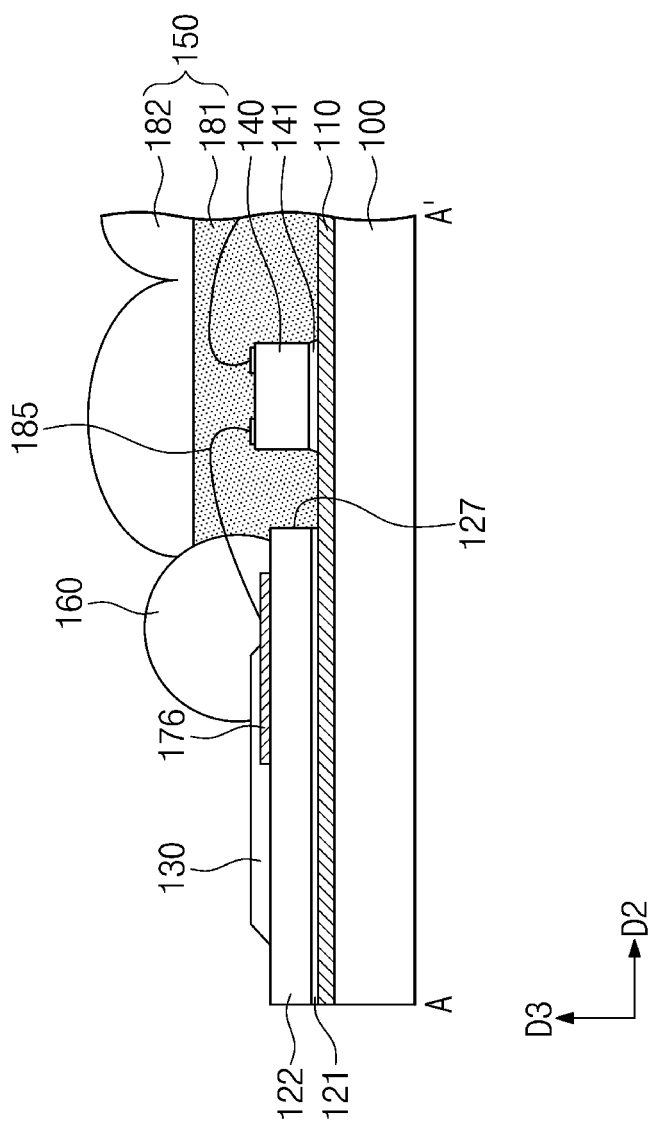
FIGS. 6A and 6B are cross-sectional views, taken along lines A-A' and B-B' of FIG. 1, respectively, illustrating a method of fabricating a semiconductor light emitting device package, according to exemplary embodiments.
Figure 6B:
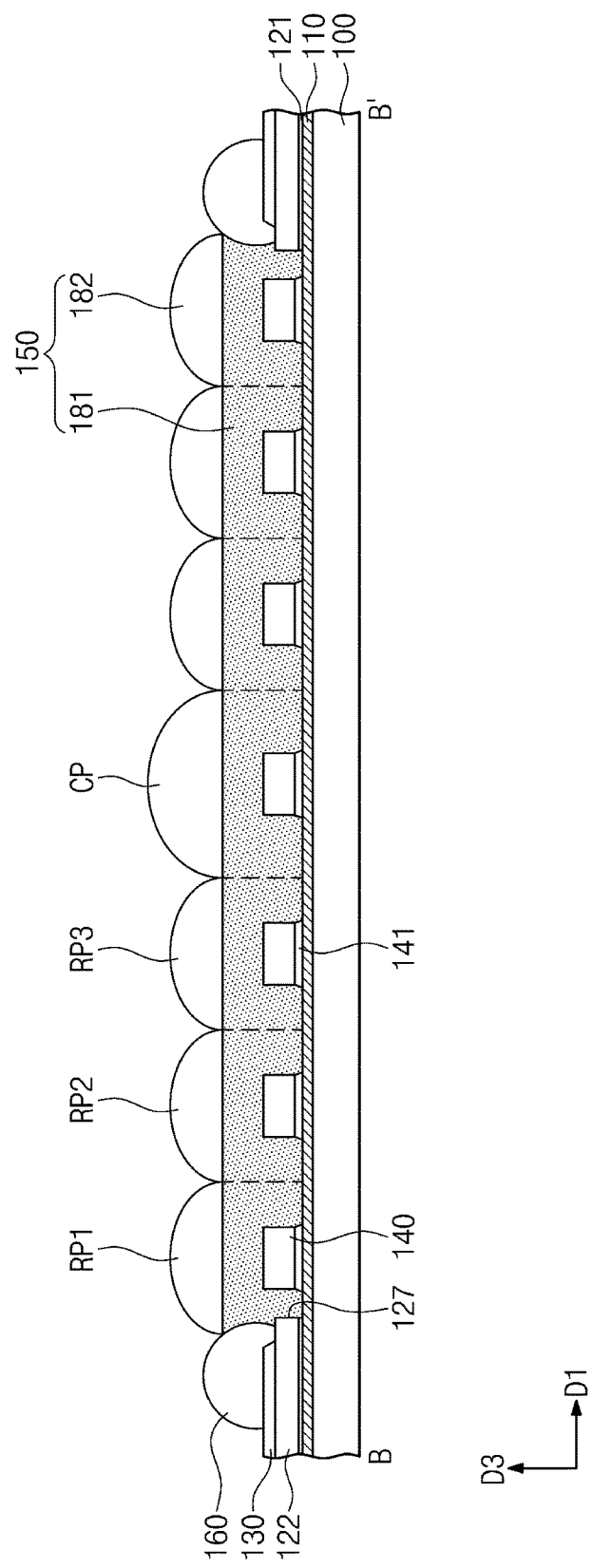

FIGS. 6A and 6B are cross-sectional views, taken along lines A-A' and B-B' of FIG. 1, respectively, illustrating a method of fabricating a semiconductor light emitting device package, according to exemplary embodiments. A repetitive description may be omitted for conciseness.

Referring to FIGS. 1, 6A and 6B, the encapsulation layer 150 may include a first layer 181 and a second layer 182 on the first layer 181. The second layer 182 may be spaced apart from the semiconductor light emitting device 140 with the first layer 181 interposed therebetween. At least one of the first and second layers 181 and 182 may include a fluorescent substance. For example, the first layer 181 may include a fluorescent substance and the second layer 182 may have no fluorescent substance. The second layer 182 may be formed of a material whose thixotropy is greater than that of a material constituting the first layer 181. For example, the first layer 181 may be formed of a material having a relatively low thixotropy to fill the opening 127. The low thixotropy may allow the first layer 181 to have a substantially flat top surface. Alternatively, the first layer 181 may be formed to have a rugged top surface. In the same manner as the formation of the encapsulation layer 150 of FIGS. 2A and 2B, the second layer 182 may be formed to include the center portion CP and the plurality of ring portions RP1, RP2 and RP3.

Figure 7B:
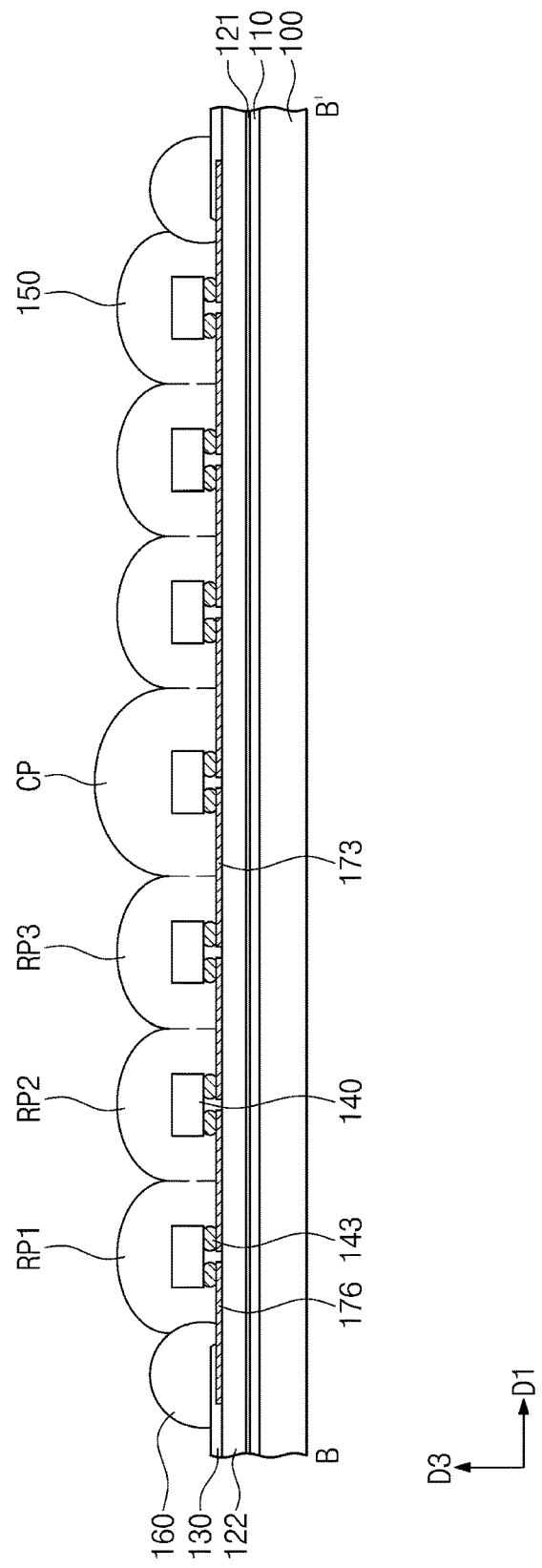

FIGS. 7A and 7B are cross-sectional views, taken along lines A-A' and B-B' of FIG. 1, respectively, illustrating a method of fabricating a semiconductor light emitting device package, according to exemplary embodiments. A repetitive description may be omitted for conciseness.

Referring to FIGS. 1, 7A and 7B, the metal stack pattern 122 may be formed on the substrate 100, and the metal stack pattern 122 may be patterned to form the cathode 170, the anode 175, and internal lines 173. For example, the substrate 100 may be a metal substrate such as aluminum, a nitride-based substrate such as aluminum nitride, or an oxide-based substrate such as alumina. The internal lines 173 may be interconnection lines for connecting the semiconductor light emitting devices 140 to each other. The semiconductor light emitting devices 140 may be flip-chip bonded on the internal lines 173 with bumps 143 interposed therebetween. The metal stack pattern 122 may adhere to a top surface of the substrate 100 by the first adhesive pattern 121. The masking pattern 130 may cover a portion of the cathode 170, a portion of the anode 175, and portions of the internal lines 173. For example, the masking pattern 130 may include a glass coat. The dam structure 160 may be formed on the metal stack pattern 122 on which the masking pattern 130 is formed, and the encapsulation layer 150 may be formed in the light emitting region.

Figure 8A:
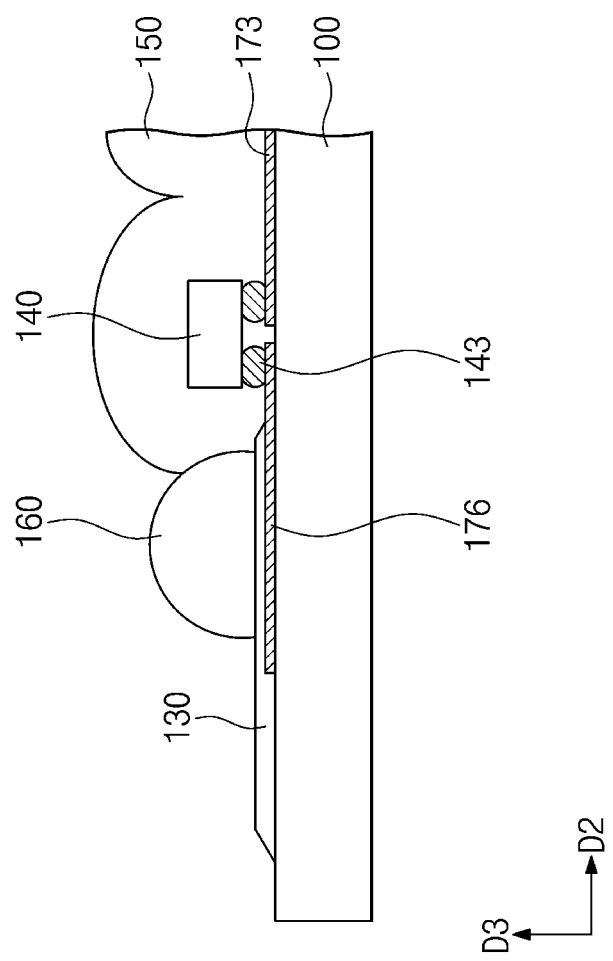
FIGS. 8A and 8B are cross-sectional views, taken along lines A-A' and B-B' of FIG. 1, respectively, illustrating a method of fabricating a semiconductor light emitting device package, according to exemplary embodiments.
Figure 8B:
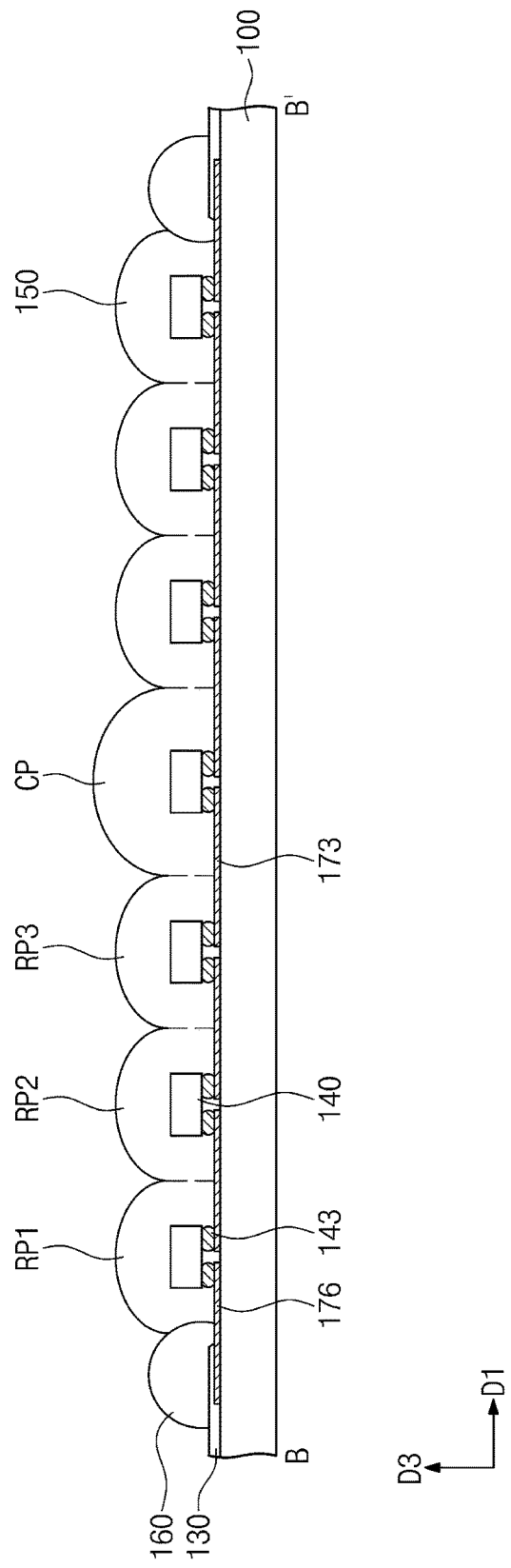

FIGS. 8A and 8B are cross-sectional views, taken along lines A-A' and B-B' of FIG. 1 from which the metal stack pattern 122 is omitted, respectively, illustrating a method of fabricating a semiconductor light emitting device package, according to exemplary embodiments. A repetitive description may be omitted for conciseness.

Referring to FIGS. 1, 8A and 8B, the cathode 170, the anode 175, and the internal lines 173 may be provided on the substrate 100. The substrate 100 may be a ceramic substrate, and the internal lines 173 may be in contact with a top surface of the substrate 100. A screen printing process may be conducted to form the cathode 170, the anode 175, and the internal lines 173.

The internal lines 173 may be interconnection lines for connecting the semiconductor light emitting device 140 to each other. The semiconductor light emitting devices 140 may be flip-chip bonded on the internal lines 173 with the bumps 143 interposed therebetween. The masking pattern 130 may cover a portion of the cathode 170, a portion of the anode 175, and portions of the internal lines 173. The internal lines 173 may have top surfaces that are exposed between the semiconductor light emitting devices 140, and the masking pattern 130 may cover the exposed top surfaces of the internal lines 173.

For example, the masking pattern 130 may include a glass coat. The dam structure 160 may be formed on the masking pattern 130, and the encapsulation layer 150 may be formed in the light emitting region.

According to exemplary embodiments, the semiconductor light emitting device package may increase light extraction efficiency due to the encapsulation layer including ring and center portions with convex parts.

Although the inventive concept has been described in connection with the exemplary embodiment illustrated with the accompanying drawings, it is not limited thereto. It will be apparent to those skilled in the art that various substitution, modifications and changes may be thereto without departing from the scope and spirit of the inventive concept.

What is claimed is:

1. A semiconductor light emitting device package comprising:
   a substrate;
   a semiconductor light emitting device on the substrate; and
   an encapsulation layer which covers the semiconductor light emitting device,
   wherein the encapsulation layer comprises:
      a plurality of ring portions which are disposed sequentially from an edge toward a center of the substrate, in a plan view; and
      a center portion which is surrounded by an innermost one of the plurality of ring portions,
   wherein the semiconductor light emitting device package further comprises a dam structure which extends along an outer sidewall of an outermost one of the plurality of ring portions, and
   wherein the dam structure is substantially transparent.

2. The semiconductor light emitting device package of claim 1, wherein each of the center portion and the plurality of ring portions has a convex upper part which convexly protrudes in a direction away from the substrate.

3. The semiconductor light emitting device package of claim 1, wherein the center portion has a height from a top surface of the substrate greater than that of each of the plurality of ring portions.

4. The semiconductor light emitting device package of claim 1, wherein the center portion has a diameter greater than a width of each of the plurality of ring portions.

5. The semiconductor light emitting device package of claim 2, wherein the center portion has a height from a top surface of the substrate which is substantially the same as that of each of the plurality of ring portions.

6. The semiconductor light emitting device package of claim 1, wherein the encapsulation layer comprises a fluorescent substance.

7. The semiconductor light emitting device package of claim 1, wherein the encapsulation layer comprises:
   a first layer which is in contact with the semiconductor light emitting device; and a second layer which is spaced apart from the semiconductor light emitting device with the first layer interposed therebetween, and comprises a material of which thixotropy is greater than that of a material constituting the first layer, wherein at least one of the first and second layers comprises a fluorescent substance.

8. The semiconductor light emitting device package of claim 1, wherein the dam structure comprises a material having more than 90% of a visible light transmittance.

9. The semiconductor light emitting device package of claim 1, further comprising a metal stack pattern which is disposed on the substrate and defines a light emitting region on which the encapsulation layer is provided, wherein the metal stack pattern comprises electrodes electrically connected to the semiconductor light emitting device.

10. The semiconductor light emitting device package of claim 1, wherein the plurality of ring portions have substantially a same width.

* * * * *